US008975504B2

(12) United States Patent
Yoon

(10) Patent No.: US 8,975,504 B2
(45) Date of Patent: Mar. 10, 2015

(54) EMBEDDED OPTICAL ELEMENT PACKAGE MODULE USING A THERMOCOUPLE

(76) Inventor: Dong Han Yoon, Gumi-si (KR)

( * ) Notice: Subject to any disclaimer, the term of this patent is extended or adjusted under 35 U.S.C. 154(b) by 0 days.

(21) Appl. No.: 13/703,880

(22) PCT Filed: Jun. 14, 2011

(86) PCT No.: PCT/KR2011/004327
§ 371 (c)(1),
(2), (4) Date: Dec. 12, 2012

(87) PCT Pub. No.: WO2011/159077
PCT Pub. Date: Dec. 22, 2011

(65) Prior Publication Data
US 2013/0081666 A1  Apr. 4, 2013

(30) Foreign Application Priority Data
Jun. 14, 2010 (KR) .................. 10-2010-0056176

(51) Int. Cl.
H01L 35/30 (2006.01)
H01L 35/32 (2006.01)
H01L 35/20 (2006.01)
H01L 25/075 (2006.01)
H01L 33/64 (2010.01)

(52) U.S. Cl.
CPC ............ *H01L 35/32* (2013.01); *H01L 25/0753* (2013.01); *H01L 35/20* (2013.01); *H01L 35/30* (2013.01); *H01L 33/641* (2013.01); *H01L 33/642* (2013.01); *H01L 2924/0002* (2013.01)
USPC ....................................... 136/205

(58) Field of Classification Search
CPC ..... H01L 35/00; H01L 37/00; H01L 25/0723; H01L 37/30; H01L 37/32; H01L 37/20; H01L 37/641; H01L 37/642
USPC .......................................... 136/205
See application file for complete search history.

(56) References Cited

U.S. PATENT DOCUMENTS

| 6,362,740 B1 * | 3/2002 | Jung ............................. 340/584 |
| 2007/0125413 A1 * | 6/2007 | Olsen et al. .................. 136/205 |

(Continued)

FOREIGN PATENT DOCUMENTS

| JP | 2006179894 A | 7/2006 |
| JP | 2007234913 A | 9/2007 |

(Continued)

OTHER PUBLICATIONS

Miyazaki et al, JP 2004296989 A, English machine translation, Oct. 21, 2004, pp. 1-16.*

(Continued)

Primary Examiner — Jeffrey T Barton
Assistant Examiner — Tae-Sik Kang
(74) Attorney, Agent, or Firm — Park & Associates IP Law, P.C.

(57) ABSTRACT

An embedded optical element package module uses a thermocouple, which increases the optical output efficiency of an optical element, dissipates high-temperature heat generated by the optical element having high output to prevent degradation, converts waste heat into electrical energy, and supplies the electrical energy as a power source for the optical element to reutilize resources, thereby reducing the amount of power consumed by the optical element and minimizing costs.

11 Claims, 3 Drawing Sheets

(56) References Cited

U.S. PATENT DOCUMENTS

| | | | |
|---|---|---|---|
| 2008/0006843 A1* | 1/2008 | Dai et al. | 257/99 |
| 2008/0087317 A1* | 4/2008 | Takahashi | 136/238 |
| 2009/0126771 A1* | 5/2009 | Takahashi | 136/203 |
| 2010/0020553 A1* | 1/2010 | Teng et al. | 362/373 |
| 2010/0326487 A1* | 12/2010 | Komori et al. | 136/226 |

FOREIGN PATENT DOCUMENTS

| | | |
|---|---|---|
| KR | 1020060070809 A | 6/2006 |
| KR | 1020060112574 A | 11/2006 |
| KR | 1020100048320 A | 5/2010 |
| WO | WO 2010058553 A1 * | 5/2010 |

OTHER PUBLICATIONS

Intersect-Definition, "Definition of Intersect", Merriam-Webster, [online], [retrieved on Mar. 11, 2014]. Retrieved from the Internet:<URL: http://www.merriam-webster.com/dictionary/intersect>, pp. 1-3.*

Tatsuo Tokiai, JPH0227779 A, English Abstract, Jan. 30, 1990, pp. 1-6.*

International Search Report for PCT/KR2011/004327, Korean Intellectual Property Office, Feb. 16, 2012.

* cited by examiner

| KINDS OF THERMOCOUPLES | | | | | | | | |
|---|---|---|---|---|---|---|---|---|
| Material | Old symbol | New symbol | Material | | Wire Diameter (mm) | Normally working temperature (°C) | Overheating temperature (°C) | Electric resistance (Ω/m) |
| | | | +junction line | -junction line | | | | |
| platinum-rhodium | B | | platinum 70% rhodium 30% | platinum 94% rhodium 6% | 0.1 | 1,500 | 1,700 | 1.75 |
| platinum rhodium-platinum | R | | platinum, rhodium 13% | pure platinum | 0.5 | 1,400 | 1,600 | 1.47 |
| platinum rhodium-platinum | S | | platinum, rhodium 13% | pure platinum | | | | 1.43 |
| chromel - alumel | K | CA | alloy mainly containing nickel and chrome nickel: 90% chrome 10% | alloy mainly containing nickel nickle: 94% aluminum: 3% antimony: 1% manganese: 2% | 0.65 | 650 | 850 | 2.95 |
| | | | | | 1 | 750 | 950 | 1.25 |
| | | | | | 1.6 | 850 | 1,050 | 0.49 |
| | | | | | 2.3 | 900 | 1,100 | 0.24 |
| | | | | | 3.2 | 1,000 | 1,200 | 0.12 |
| chromel - constantan | E | CRC | alloy mainly containing nickel and chrome nickel: 90% chrome 10% | alloy mainly containing copper and nickel copper: 55% nickel: 45% | 0.65 | 450 | 500 | 3.56 |
| | | | | | 1 | 500 | 550 | 1.5 |
| | | | | | 1.6 | 550 | 650 | 0.59 |
| | | | | | 2.3 | 600 | 750 | 0.28 |
| | | | | | 3.2 | 700 | 800 | 0.15 |
| iron - constantan | J | IC | pure iron | alloy mainly containing copper and nickel copper: 55% nickel: 45% | 0.65 | 400 | 500 | 1.7 |
| | | | | | 1 | 450 | 550 | 0.72 |
| | | | | | 1.6 | 500 | 650 | 0.28 |
| | | | | | 2.3 | 550 | 750 | 0.14 |
| | | | | | 3.2 | 600 | 750 | 0.07 |
| copper-constantan | T | CC | pure copper | alloy mainly containing copper and nickel copper: 55% nickel: 45% | 0.32 | 200 | 250 | 0.17 |
| | | | | | 0.65 | 200 | 250 | 1.5 |
| | | | | | 1 | 250 | 300 | 0.63 |
| | | | | | 1.6 | 300 | 350 | |

FIG. 3

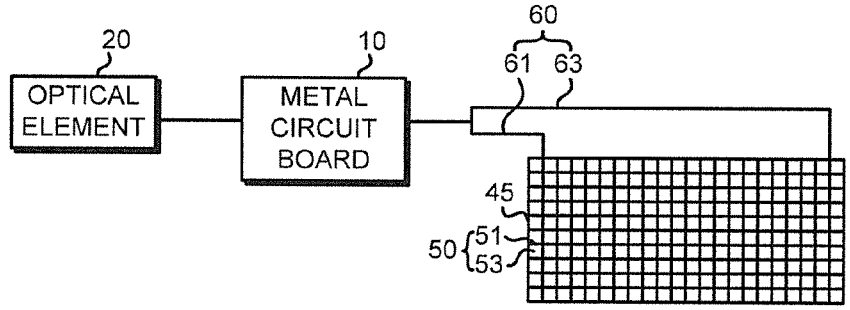

FIG. 4

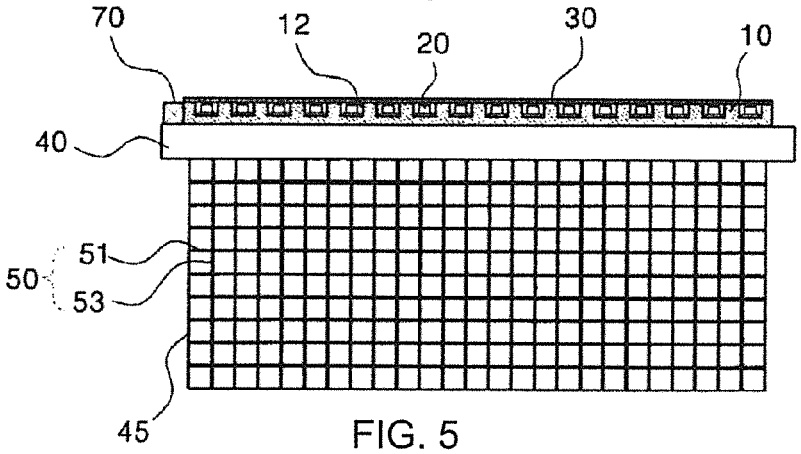

FIG. 5

EMBEDDED OPTICAL ELEMENT PACKAGE MODULE USING A THERMOCOUPLE

PRIORITY

The present application claims priority under 35 U.S.C. §371 to PCT Application PCT/KR2011/004327, filed on Jun. 14, 2011, which claims priority to Korean Patent Application No. 10-2010-0056176, filed on Jun. 14, 2010, the disclosures of which are hereby incorporated by reference in their entireties.

TECHNICAL FIELD

The present invention relates to an embedded optical element package module using a thermocouple, and more particularly to an embedded optical element package module using a thermocouple having a structure in which optical elements are embedded in a board formed of a metal having excellent heat dissipation and light reflection efficiency, and which improves optical power of the optical elements, rapidly dissipates high heat generated from the high power optical elements so as to prevent degradation, and reuses resources, by executing conversion of waste heat into electric energy and then supplying the electric energy to the optical elements as a power source, so as to greatly reduce power consumption taken to supply power to the optical elements and to minimize power expenditure.

BACKGROUND ART

In general, applications of optical elements including light emitting diodes (LEDs) as next generation illumination sources have been gradually increased. Among these, an LED is a kind of semiconductor element which converts electrical energy into light energy using characteristics of a semiconductor formed of a specific compound, has high light conversion efficiency and thus achieves energy consumption reduction of up to 90% at maximum as compared with conventional illumination, such as incandescent lamps and fluorescent lamps, has a small size and is thus proper for miniaturization and lightweight trends, is capable of being infinitely expanded, and has a semi-permanent lifespan.

Further, since the LED has advantages that it does not execute thermal light-emission or discharge light-emission and does not require pre-heating and thus has fast response time and a simple lighting circuit, and does not use a discharge gas and a filament and thus has high impact resistance and is safe, scarcely causes environment pollution, executes high repetition pulse operation, decreases fatigue of the optical nerve and executes full color realization, the LED is widely used in various digital products or home appliances and peripheral devices. Particularly, as a high luminance LED solving a low luminance problem of the conventional LED comes onto the market, purposes and usages of the LED are expanded.

Particularly, since a white LED is very useful as indoor and outdoor illumination, the frequency of use of the white LED is rapidly expanding and it is predicted that the white LED will dominate the illumination market soon because the government promotes a plan of raising the supply rate of the white LED in consideration of high energy efficiency and environmentally friendly advantages of the white LED together with a tendency to replace incandescent lamps with fluorescent lamps.

In relation to such an LED, Korean Patent Registration No. 10-0958024 discloses a light emitting diode (optical element) package including a metal board provided with at least one via hole, an insulating layer formed on the surface of the metal board including the inner surface of the at least one via hole, a plurality of metal patterns formed on the insulating layer and electrically isolated from each other, and LED chips mounted on the metal patterns, and characterized in that heat generated from the LED chips may be effectively dissipated to the outside through the metal board.

However, since the above-described optical element package has a structure in which optical elements emitting light are located on the upper surface of the metal board and protrude from the upper surface of the metal board, the optical element package may be easily damaged by external impact, and energy transmitted by power is dissipated as optical power and thus a large amount of energy needs to be supplied to obtain a higher power light source, thereby causing increase in power consumption.

An optical element using light sources, such as LEDs, is essentially a semiconductor element, and is thus relatively weak to heat as compared to light emitting elements, such as incandescent lamps or fluorescent lamps. Therefore, when junctions within the semiconductor element maintain a constant temperature, the semiconductor element may maintain the original advantages thereof, such as high light emitting efficiency and long lifespan. That is, in case of an LED, the LED may maintain the original advantages thereof if the temperature of junctions of the semiconductor element maintains 85° C. or less always.

Therefore, research on techniques relating to optical elements, such as LEDs, to improve light emitting efficiency of LED chips and to efficiently extract the light emitting efficiency and research on application of optical element light sources to various fields have been conventionally carried out. However, as heat generated from an optical element during driving directly influences optical efficiency of the optical element light source and the optical element is applied to high power lamps, problems due to generated heat become serious.

Accordingly, a structure of an optical element in which a heat dissipation plate serving to dissipate heat generated during driving of the optical element is connected to a semiconductor element has been proposed.

In relation to such a heat dissipation plate applied to LEDs, Korean Utility Model Registration No. 20-0448163 discloses a heat dissipation plate for LED lamps which is installed on an LED lamp. Such a heat dissipation plate for LED lamps includes at least one heat dissipation fin connected to a case of the lamp and formed on the upper portion of the heat dissipation plate to have a sufficient heat dissipation area, a support to fix a circuit board on which at least one LED is mounted, at least one connection fixing groove formed on the lower portion of the heat dissipation plate so that the support is inserted into the at least one connection fixing groove, and a fixing screw to fix the circuit board to the support, the support includes at least one screw hole formed at a designated interval along the center of the support, the circuit board includes at least one tightening hole formed along the center of the circuit board so as to correspond to the at least one screw hole of the support, the at least one LED is arranged between the at least one tightening hole and is installed integrally with the heat dissipation plate for LED lamps by fixing the circuit board to the support by combining the fixing screw with the at least one screw hole and the at least one tightening hole, the at least one heat dissipation fin is formed integrally with the at least one connection fixing groove, and the heat dissipation plate for LED lamps is formed of an extruded product using aluminum and may thus minimize heat resistance and maximize heat dissipation effect.

However, the above-described conventional heat dissipation plate merely exhibits a function of dissipating heat, generated from semiconductor elements due to light emission of optical elements, to the outside, and such heat is only dissipated to the outside but is not used as energy. Recently, as problems due to lack of resources become more serious, solutions to conserve resources are urgently required and development of techniques to improve requirements for using waste heat inevitably generated in the optical element field having a high application degree are required.

Technical Problem

Therefore, the present invention has been made in view of the above problems, and it is an object of the present invention to provide an embedded optical element package module using a thermocouple having a structure in which optical elements are embedded in a board formed of a metal having a heat dissipation function and excellent light reflection efficiency, and which forms high power and high efficiency light sources of the optical elements by supply of a small amount of electric power.

It is another object of the present invention to provide an embedded optical element package module which rapidly dissipates high heat generated from high power optical elements so as to prevent shortening of the lifespan of the optical elements due to degradation, and reuses waste resources, by converting waste heat into electric energy and supplying such electrical energy to the optical elements as a power source, so as to minimize power consumption of the optical elements and to maximize energy efficiency of the optical elements.

Technical Solution

In accordance with an aspect of the present invention, the above and other objects can be accomplished by the provision of an embedded optical element package module using a thermocouple including a metal circuit board formed of a metal having thermal conductivity and provided with a plurality of hollow mounting spaces formed on the upper surface thereof, optical elements respectively embedded in the plurality of mounting spaces of the metal circuit board, a molding part installed at the upper end of the metal circuit board, closing the plurality of mounting spaces in which the optical elements are embedded, and formed of a transparent resin, and a heat dissipation plate installed at the lower end of the metal circuit board and provided with a plurality of heat dissipation fins to dissipate heat.

The heat dissipation plate includes the thermocouple arranged in the shape of a checkerboard on the heat dissipation fins, converting heat energy transmitted from the optical elements into thermoelectromotive force, and generating thermoelectric current at junctions where two kinds of metals having different thermal conductivities intersect, and an external supply terminal connected to the outer rim of the thermocouple and formed of a conductive metal to collect the generated thermoelectric current, to convert the thermoelectric current into electric energy, and then to supply the electric energy to the optical elements.

The embedded optical element package module may further include a charging device connected to the external supply terminal, collecting and storing the electric energy generated through the thermoelectric current and supplying the electric energy to the optical elements as needed.

The external supply terminal may collect the thermoelectric current generated from the thermocouple, supply the thermoelectric current to the optical elements as a power source, and be divided into an anode terminal and a cathode terminal.

The metal circuit board may be a metal core printed circuit board (MCPCB) having an excellent heat dissipating function among metals.

The thermocouple may include a plurality of first metal bodies arranged in the horizontal direction on the flat surfaces of the heat dissipation plate and a second heat dissipation plate and separated by the same interval, and a plurality of second metal bodies arranged in the vertical direction so as to intersect the plurality of first metal bodies and separated by the same interval on the heat dissipation plate and the second heat dissipation plate.

The plurality of first metal bodies and the plurality of second metal bodies of the thermocouple may be formed of a thin metal sheet so as to be deposited on the heat dissipation fins, or be formed of nano metal powder so as to be formed on the heat dissipation fins through silk screen printing.

The plurality of first metal bodies and the plurality of second metal bodies of the thermocouple may be formed of materials having different thermal conductivities, cause different exothermic temperatures due to the different thermal conductivities to heat transmitted to the circuit board by the optical elements when such heat is dissipated, and generate thermoelectric current due to a temperature difference between the different temperatures of the plurality of first metal bodies and the plurality of second metal bodies.

Each of the plurality of first metal bodies and the plurality of second metal bodies of the thermocouple may form one electrode from among an anode generating a high electric potential and a cathode generating a low electric potential, so that the plurality of first metal bodies and the plurality of second metal bodies form electrodes having different polarities.

The plurality of first metal bodies and the plurality of second metal bodies of the thermocouple may be formed of one kind of alloy material, selected from the group consisting of platinum-rhodium, platinum rhodium-platinum, chromel-alumel, chromel-constantan, iron-constantan and copper-constantan.

The thermocouple may be formed to generate thermoelectric current in different types by differently selecting at least one of alloy ratios, kinds of metals, metal wire diameters, normally working temperatures, overheating temperatures and electric resistances of the alloy materials forming the plurality of first metal bodies and the plurality of second metal bodies.

Advantageous Effects

The above-described embedded optical element package module in accordance with the present invention has a structure in which the optical elements are embedded in the board formed of a metal having a heat dissipation function and excellent light reflection efficiency, and thus forms high power light sources of the optical elements by supply of a small amount of electric power, thus maximizing efficiency of the optical elements Further, the embedded optical element package module in accordance with the present invention rapidly dissipates high heat generated due to high power of the optical elements on the metal circuit board to prevent shortening of the lifespans of the optical elements and the metal circuit board due to degradation, and reuses waste resources and reduces the amount of electric energy taken to drive the optical elements, by converting dissipated waste heat into electric energy necessary to drive the optical elements and supplying such electrical energy to the optical elements as a power source, to minimize power consumption and to maximize energy efficiency of the optical elements.

Further, the embedded optical element package module in accordance with the present invention stores electric energy converted from waste heat and then uses such electric energy as a power source to operate the optical elements so as to execute power supply to turn the optical elements on even in a failure of power supply, and maximally uses dissipated waste heat to maximize energy efficiency according to power consumption.

DESCRIPTION OF DRAWINGS

The above and other objects, features and other advantages of the present invention will be more clearly understood from the following detailed description taken in conjunction with the accompanying drawings, in which:

FIG. 3 is a table representing kinds of thermocouples in accordance with the embodiment of the present invention;

FIG. 4 is a view illustrating the concept of the thermocouple in accordance with the embodiment of the present invention;

FIG. 5 is a cross-sectional view illustrating an embedded optical element package module using a thermocouple in accordance with another embodiment of the present invention.

BEST MODE

Figure 1:
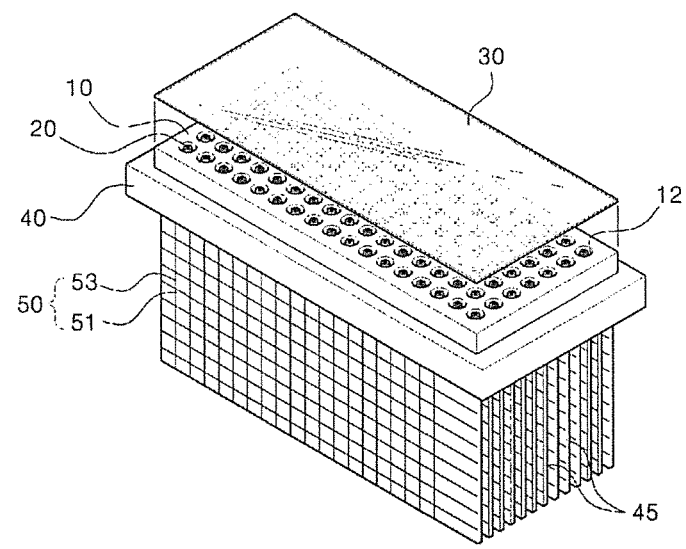
FIG. 1 is an exploded perspective view illustrating an embedded optical element package module using a thermocouple in accordance with one embodiment of the present invention.

Now, embedded optical element package modules using a thermocouple in accordance with preferred embodiments of the present invention will be described in detail with reference to the annexed drawings. In the drawings, the same or similar elements are denoted by the same reference numerals even though they are depicted in different drawings, and a detailed description thereof will thus be omitted because it is considered to be unnecessary.

However, the embodiments of the present invention may be variously modified, and it is not interpreted that the scope of the invention is limited by embodiments described later. The embodiments of the present invention have been given only for those skilled in the art to better understand the present invention, and the shapes, etc. of elements shown in the drawings are exemplarily given to more clearly describe the present invention.

First, an embedded optical element package module using a thermocouple in accordance with one embodiment of the present invention, as shown in FIGS. 1 to 4, includes a metal circuit board 10, optical elements 20, a molding part 30 and a heat dissipation plate 40.

The metal circuit board 10 is formed of a metal having conductivity. That is, the metal circuit board 10 is formed of a metal having higher thermal conductivity than a synthetic resin and ceramic.

The metal circuit board 10 is a metal core printed circuit board (MCPCB) having an excellent heat dissipating function among metals.

For example, the metal circuit board 10 is formed of a mixture of a material generally having non-conductive characteristics which forms an insulating layer, such as silicon or epoxy, and a material to improve thermally conductive characteristics, such as alumina or copper powder.

Further, the metal circuit board 10 may use an aluminum oxide film as an insulating layer. The insulating layer of the aluminum oxide film is formed through electrical reaction between an aluminum surface and an electrolyte solution.

Further, the metal circuit board 10 may use a pure aluminum oxide layer formed by anodization to have excellent thermal conductivity maintaining the original thermal conductivity of 30~35 W/mK of an aluminum oxide.

Figure 2:
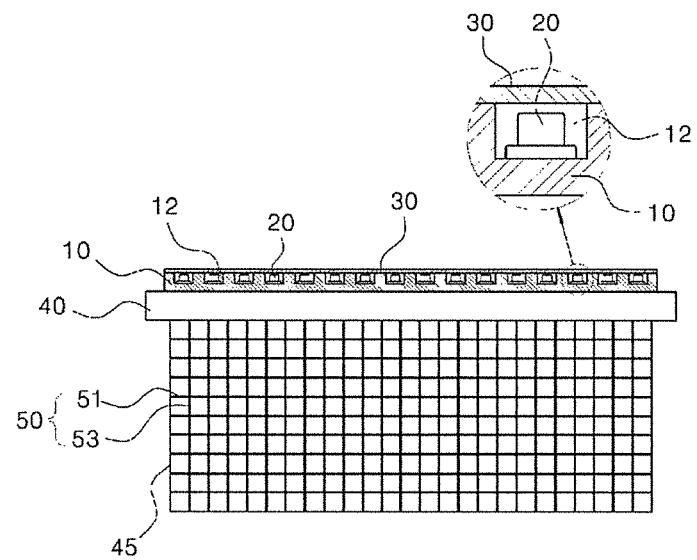
FIG. 2 is a cross-sectional view illustrating the embedded optical element package module in accordance with one embodiment of the present invention.

A plurality of hollow molding spaces 12 having a designated depth is formed in the shape of a recess on the upper surface of the metal circuit board 10, as shown in FIGS. 1 and 2.

The mounting spaces 12 have a depth greater than the height of the embedded optical elements 20.

The mounting spaces 12 may be formed by etching or drilling, or be formed through various other methods through which hollow recesses may be formed on a thin board.

The mounting spaces 12 are formed in a circular shape, the upper surface of which is opened, (as seen from the plane) so that the optical elements 20 are inserted into the mounting spaces 12 from the top. The mounting spaces 12 may be formed in various shapes, such as a rectangular cross-sectional shape, and is preferably formed in a shape corresponding to the shape of the optical elements 20.

The wall forming the mounting space 12 may be extended upward from the horizontal bottom surface of the mounting space 12 and be parallel with the side surface of the optical element 20 after the optical element 20 is embedded in the metal circuit board 10 so as to minimize loss of heat generated from the optical element 20, or the wall forming the mounting space 12 may be inclined in a cup shape such that the cross-sectional area of the mounting space 12 is decreased in the downward direction toward the bottom surface of the mounting space 12 so as to reflect light emitted from the optical element 20 in the forward direction to increase light emission efficiency.

The wall forming the mounting space 12 has excellent reflection efficiency by the effect of the material of the metal circuit board 10. Further, in order to allow the wall of the mounting space 12 to serve as a reflecting mirror, the inner surface of the mounting space 12 may be formed of a material having higher light reflection efficiency.

For example, a reflective layer (not shown) is formed on the inner surface of the mounting space 12 by applying one selected from the group consisting of metals and metal alloys having excellent light reflectivity including gold, silver, copper and platinum, to the inner surface of the mounting space 12 or by depositing such a metal mixture processed into a thin film type on the inner surface of the mounting space 12.

The optical elements 20 are embedded in the metal circuit board 10 so as to be located within the mounting spaces 12 of the metal circuit board 12.

When the optical elements 20 are embedded in the metal circuit board 10, the optical element 20 is located at the center of the inside of the mounting space 12 so that light generated from the optical element 20 may be uniformly emitted in all directions.

Protrusions (not shown) protruding to the same length in all directions may be formed on the optical elements 12 and the mounting spaces 12 so that the optical element 20 may be located at the center of the inside of the mounting space 12.

The molding part 30 is installed at the upper end of the metal circuit board 10, and serves to close the mounting spaces 12 in which the optical elements 20 are embedded and to protect or support the optical elements 20 embedded in the mounting spaces 12.

The molding part 30 may set the spreading range of light generated from the optical elements 20 to exhibit optical effects of amplifying or concentrating light generated from the optical elements 20 according to purpose of the optical elements 20. In more detail, the molding part 30 may be formed such that the thickness of the molding part 30 is the maximum at the central portion thereof where the optical elements 20 are embedded in the mounting spaces 12 of the metal circuit board 10 and is gradually decreased in sideward directions from the central portion thereof, so as to exhibit the effect of a convex lens and thus to amplify light generated from the optical elements 20. Further, the molding part 30 may be formed such that the thickness of the molding part 30 is the minimum at the central portion thereof where the optical elements 20 are embedded in the mounting spaces 12 of the metal circuit board 10 and is gradually increased in sideward directions from the central portion thereof, so as to exhibit the effect of a concave lens and thus to concentrate light generated from the optical elements 20.

In case of a structure in which plural mounting spaces 12 are formed on one metal circuit board 10 and plural optical elements 20 are embedded in the mounting spaces 12, one molding part 30 may be installed above the metal circuit board 10, or plural molding parts 30 may be respectively installed above the mounting spaces 12 in which the optical elements 20 are embedded.

The molding part 30 is formed of a transparent resin. That is, fluorescent materials may be mixed with a material forming the molding part 30 so as to realize various background effects through light emitted from the optical elements 20 according to purpose of the optical elements 20 and necessity.

The heat dissipation plate 40, as shown in FIGS. 1 and 2, is installed at the lower end of the metal circuit board 10, serves to dissipate heat transmitted from the optical elements 20, and includes a thermocouple 50 and an external supply terminal 60.

The thermocouple 50 formed on the heat dissipation plate 40 converts heat energy transmitted through heat generated from the optical elements 20 into thermoelectromotive force to generate thermoelectric current.

The thermocouple 50 is based on the fundamental action of a thermoelectric element causing the thermoelectric effect.

Here, the thermoelectric element means a semiconductor element executing conversion between heat energy and electric energy. That is, the thermoelectric element is a generic name for elements using various effects exhibited by interaction between heat and electricity, i.e., a thermistor used in stabilization of a circuit and detection of heat, power and light, an element using the Seebeck effect for temperature measurement, and a Peltier element used for manufacture of a freezer and a constant-temperature incubator.

Such a thermocouple 50 is formed using the Seebeck effect among various effects of thermoelectric elements.

Here, the Seebeck effect is an effect in which electromotive force is generated by a temperature difference between junctions of two different metals. In more detail, the Seebeck effect refers to a phenomenon in which current is generated in a metal circuit when two different metals are connected in a loop shape, and one junction is in a high temperature state and the other junction is in a low temperature state.

Electromotive force generated according to the Seebeck effect is proportional to the temperature difference between the two junctions. Further, the intensity of the thermoelectric current is varied according to kinds of metals in a pair and a temperature difference between two junctions, and electric resistance of a metal wire participates in the intensity of the thermoelectric current.

The thermocouple 50 is arranged in the shape of a checkerboard on heat dissipation fins 45. That is, the thermocouple 50 is formed in a lattice shape in which plural lines formed of metals are horizontally and vertically arranged in designated intervals on the flat side surfaces of the plural heat dissipation fins 45 of the heat dissipation plate 40.

The thermocouple 50 may be formed on one side surface of each of the heat dissipation fins 29, or may be formed on both side surfaces of each of the heat dissipation fins 29. Preferably, the thermocouple 50 is formed on both side surfaces of each of the heat dissipation fins 45 to effectively transmit waste heat generated from the optical elements 20.

The thermocouple 50 converts heat energy transmitted from the optical elements 20 into thermoelectromotive force, and generates thermoelectric current at junctions where two kinds of metals having different thermal conductivities intersect.

The thermocouple 50 includes a plurality of first metal bodies 51 and a plurality of second metal bodies 53 formed of two kinds of metals having different thermal conductivities.

The plurality of first metal bodies 51 is arranged in the horizontal direction on both flat surfaces of the heat dissipation fins 45 at the same interval, and the plurality of second metal bodies 53 is arranged in the vertical direction on both flat surfaces of the heat dissipation fins 45 at the same interval so as to intersect the plurality of first metal bodies 51.

The first metal bodies 51 and the second metal bodies 53 of the thermocouple 50 are formed of a thin metal sheet so as to be deposited on the heat dissipation fins 45, or may be formed using nano metal powder so that the first metal bodies 51 and the second metal bodies 53 may be formed on the heat dissipation fins 45 through silk screen printing.

The first metal bodies 51 and the second metal bodies 53 of the thermocouple 50 are formed of materials having different thermal conductivities, cause exothermic reactions at different temperatures according thermal conductivity transmitted from the optical elements 20, and generate thermoelectric current due to a temperature difference. In more detail, since one of the first metal bodies 51 and the second metal bodies 53 is formed of a good conductive metal material having high thermal conductivity and thus causes an exothermic reaction at a high temperature and the other of the first metal bodies 51 and the second metal bodies 53 is formed of an insulating metal material having low thermal conductivity and thus causes an exothermic reaction at a low temperature, voltage is generated due to a temperature difference between the different reaction temperatures and is converted into thermoelectromotive force generating flow of current, and thus thermoelectric current is generated at the junctions where the first metal bodies 51 and the second metal bodies 53 intersect.

Each of the first metal bodies 51 and the second metal bodies 53 of the thermocouple 50 form one of an anode generating a high electrical potential and a cathode generating a low electrical potential, and thus the first metal bodies 51 and the second metal bodies 53 form electrodes having different polarities. That is, one having high thermal conductivity of the first metal bodies 51 and the second metal bodies 53 has a high position energy of charges, i.e., a high electric potential, and thus forms an anode, and the other having low thermal conductivity has a low electric potential and thus forms a cathode.

The first metal bodies 51 and the second metal bodies 53 of the thermocouple 50 are formed of one kind of alloy material, selected from alloy materials including platinum-rhodium, platinum rhodium-platinum, chromel-alumel, chromel-constantan, iron-constantan, and copper-constantan, as shown in FIG. 3.

The thermocouple 50 is formed to generate thermoelectric current by differently selecting alloy ratios of the materials of the first metal bodies 51 and the second metal bodies 53.

For example, the first metal bodies 51 and the second metal bodies 53 forming the thermocouple 50 are formed of the same alloy material, i.e., platinum-rhodium, but one having high conductivity to generate a high electrical potential among the first metal bodies 51 and the second metal bodies 53 is formed of an alloy containing 70% of platinum and 30% of rhodium so as to generate an exothermic reaction at a high temperature, the other having low conductivity to generate a low electrical potential among the first metal bodies 51 and the second metal bodies 53 is formed of an alloy containing 94% of platinum and 6% of rhodium so as to generate an exothermic reaction at a low temperature, and thus heat energy is converted into theremoelectromotive force to generate thermoelectric current at junctions where the first metal bodies 51 and the second metal bodies 53 intersect due to a temperature difference. That is to say, although the same exothermic temperature condition of waste heat generated from the optical elements 20 is applied both to the first metal bodies 51 and the second metal bodies 53, the first metal bodies 51 and the second metal bodies 53 generate heat at different temperatures, and thermoelectric current is generated by the effect of thermoelectromotive force due to the temperature difference.

Further, the thermocouple 50 may generate thermoelectric current by differently selecting kinds of alloy materials forming the first metal bodies 51 and the second metal bodies 53.

For example, if the first metal bodies 51 and the second metal bodies 53 forming the thermocouple 50 are formed of different kinds of metals, i.e., chromel and alumel, one having high conductivity among the first metal bodies 51 and the second metal bodies 53 is formed of an alloy mainly containing nickel and chrome (an alloy of 90% of nickel and 10% of chrome) and the other having low conductivity among the first metal bodies 51 and the second metal bodies 53 is formed of an alloy mainly containing nickel (an alloy of 94% of nickel, 3% of aluminum, 1% of antimony and 2% of manganese), and thus thermoelectric current is generated by a temperature difference due to different thermal conductivities of the first metal bodies 51 and the second metal bodies 53.

In addition to by differently selecting alloy ratios and kinds of metals of the materials, the thermocouple 50 may be formed to generate thermoelectric current in different types by differently selecting metal wire diameters, normally working temperatures, overheating temperatures and electric resistances of the materials of the first metal bodies 51 and the second metal bodies 53, with reference to FIG. 3.

The external supply terminal 60 is connected to the outer rim of the thermocouple 50, as shown in FIG. 4.

The external supply terminal 60 is formed of a conductive metal. That is, the external supply terminal 60 may be formed of silver, copper or aluminum.

The external supply terminal 60 collects thermoelectric current generated from the thermocouple 50, converts the thermoelectric current collected from the thermocouple 50 into electric energy, and supplies the electric energy to the optical elements 20.

An insulator (not shown) is formed at the periphery of the external supply terminal 60 so as to insulate the external supply terminal 60 from the outside.

The insulator is formed of an insulating material, which is a nonconductor not transmitting electricity. That is, the insulator is formed of an insulating material, such as a synthetic resin, silicon or ceramic, and thus does not transmit electricity.

The external supply terminal 60 recovers thermoelectric current generated from the thermocouple 50, and is divided into an anode terminal 61 and a cathode terminal 63. Specifically, the anode terminal 61 is connected to one generating high thermoelectric current among the first metal bodies 51 and the second metal bodies 53 of the thermocouple 50 and thus positive charges are transmitted to the anode terminal 61, and the cathode terminal 63 is connected to the other generating low thermoelectric current among the first metal bodies 51 and the second metal bodies 53 of the thermocouple 50 and thus negative charges are transmitted to the cathode terminal 63, thereby generating electricity.

When the optical elements 20 emit light through power transmission using an operating switch, as describe above, the optical elements 20 and the metal circuit board 10 generate heat, such heat is transmitted to the heat dissipation plate 40 installed under the metal circuit board 10, is converted into electric energy by the thermocouple 50, and then the electric energy is supplied again to the optical elements 20 as a power source. Therefore, waste heat is reused as a power source of the optical elements 20. In more detail, when a large amount heat generated from the embedded optical elements 20 and the metal circuit board 10 is transmitted to the heat dissipation plate 40, such heat is conducted to the thermocouple 50 including on the first metal bodies 51 and the second metal bodies 53 formed on the heat dissipation plate 40, and the first metal bodies 51 and the second metal bodies 53 generate heat at different temperatures, thermoelectric current is generated by conversion of heat into thermoelectromotive force at the junctions where the first metal bodies 51 and the second metal bodies 53 reacting with the heat at the different temperatures intersect, is converted into electric energy via the external supply terminal 60, and such electric energy is supplied to the metal circuit board 10 and is used as a power source of the optical elements 20.

That is, the above-described embedded optical element package module in accordance with this embodiment of the present invention has a structure in which the optical elements are embedded in the board formed of a metal having a heat dissipation function and excellent light reflection efficiency, and thus forms high power light sources of the optical elements by supply of a small amount of electric power, thus maximizing efficiency of the optical elements Further, the embedded optical element package module in accordance with this embodiment of the present invention rapidly dissipates high heat generated due to high power of the optical elements on the metal circuit board to prevent shortening of the lifespans of the optical elements and the metal circuit board due to degradation, and reuses waste resources and reduces the amount of electric energy taken to drive the optical elements, by converting dissipated waste heat into electric energy necessary to drive the optical elements and supplying such electrical energy to the optical elements as a power source, to minimize power consumption and to maximize energy efficiency of the optical elements.

Figure 6:
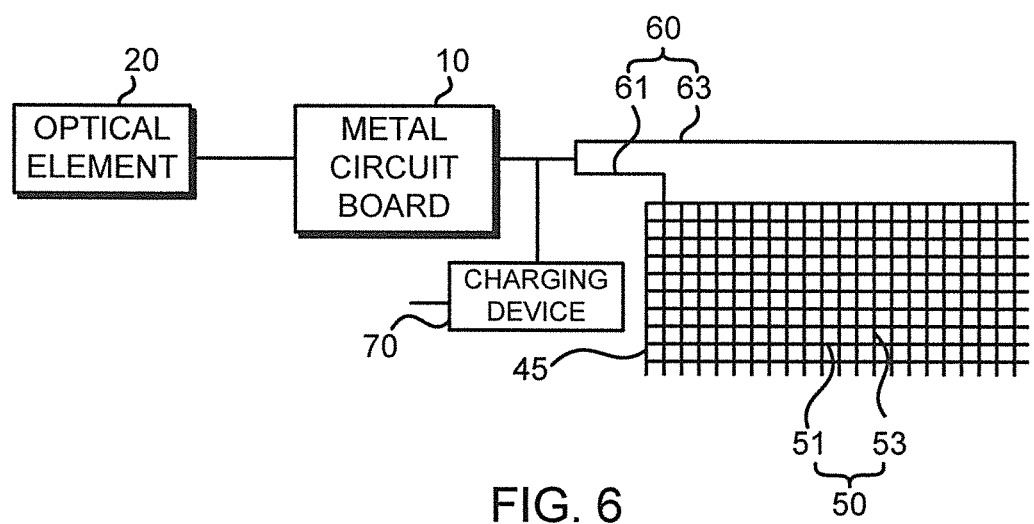
FIG. 6 is a view illustrating the concept of the thermocouple in accordance with the embodiment of the present invention.

Next, an embedded optical element package module using a thermocouple in accordance with another embodiment of the present invention, as shown in FIGS. 5 and 6, further includes a charging device 70 connected to the external supply terminal 60, collecting electric energy generated through thermoelectric current of the thermocouple 50 and then supplying the electric energy to the optical elements 20 as needed.

The charging device 70 includes a storage battery including an anode plate, a cathode plate and an electrolyte solution, storing chemical energy converted from electric energy, and regenerating electric energy from chemical energy as needed.

The charging device 70 may employ the miniaturized structure of a general storage battery used as a battery for vehicles, and a detailed description thereof will thus be omitted.

That is, the above-described embedded optical element package module in accordance with this embodiment of the present invention stores electric energy converted from waste heat and then uses such electric energy as a power source to operate the optical elements to execute power supply to turn the optical elements on even in a failure of power supply, and maximally uses dissipated waste heat to maximize energy efficiency according to power consumption.

Other components of the embedded optical element package module in accordance with this embodiment are the same as those of the embedded optical element package module in accordance with the above-described former embodiment, and a detailed description thereof will thus be omitted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An embedded optical element package module using a thermocouple comprising:
    a metal circuit board provided with a plurality of hollow mounting spaces on a first side of the metal circuit board;
    a plurality of optical elements each disposed in one of the plurality of mounting spaces of the metal circuit board;
    one or more transparent molding part closing the plurality of mounting spaces;
    a heat dissipation plate on a second side of the metal circuit board, the heat dissipation plate having a plurality of heat dissipation fins extending normal to the heat dissipating plate;
    a thermocouple; and
    an external supply terminal electrically connected to the thermocouple and to the optical elements,
    wherein the thermocouple includes a plurality of first metal bodies with a first thermal conductivity intersecting a plurality of second metal bodies with a second thermal conductivity arranged on two opposite surfaces of at least one of the plurality of heat dissipation fins.

2. The embedded optical element package module according to claim 1, further comprising a charging device connected to the external supply terminal.

3. The embedded optical element package module according to claim 2, wherein the external supply terminal collects the thermoelectric current generated from the thermocouple, supplies the thermoelectric current to the optical elements as a power source.

4. The embedded optical element package module according to claim 1, wherein the plurality of first metal bodies and the plurality of second metal bodies of the thermocouple are formed of a thin metal sheet.

5. The embedded optical element package module according to claim 1, wherein the plurality of first metal bodies and the plurality of second metal bodies of the thermocouple are formed of nano metal powder.

6. The embedded optical element package module according to claim 1, wherein the plurality of first metal bodies and the plurality of second metal bodies of the thermocouple are formed of one kind of alloy material, selected from the group consisting of platinum-rhodium, platinum rhodium-platinum, chromel-alumel, chromel-constantan, iron-constantan and copper-constantan.

7. The embedded optical element package module according to claim 6, wherein the plurality of first metal bodies and the plurality of second metal bodies of the thermocouple are formed of the same alloy material but in a different alloy ratio.

8. The embedded optical element package module according to claim 1, wherein the plurality of mounting spaces has a depth greater than the height of the optical elements.

9. The embedded optical element package module according to claim 8, wherein the plurality of mounting spaces has a circular opening and an inclined sidewall covered with a reflective layer.

10. The embedded optical element package module according to claim 9, wherein the plurality of mounting spaces is closed by a single transparent molding part having a convex shape or a concave shape.

11. The embedded optical element package module according to claim 9, wherein each of the mounting spaces is closed by a discrete transparent molding part having a convex shape or a concave shape.

* * * * *